(12) United States Patent
Satragno et al.

(10) Patent No.: US 7,863,899 B2
(45) Date of Patent: Jan. 4, 2011

(54) MAGNET STRUCTURE FOR MRI APPARATUS AND MRI APPARATUS

(75) Inventors: Luigi Satragno, Genoa (IT); Alessandro Quattrini, Genoa (IT); Stefano Pittaluga, Genoa (IT); Eugenio Biglieri, Masio (IT)

(73) Assignee: Esaote S.p.A., Milan (IT)

( * ) Notice: Subject to any disclaimer, the term of this patent is extended or adjusted under 35 U.S.C. 154(b) by 1118 days.

(21) Appl. No.: 11/578,387

(22) PCT Filed: May 2, 2005

(86) PCT No.: PCT/EP2005/052004

§ 371 (c)(1),
(2), (4) Date: Oct. 13, 2006

(87) PCT Pub. No.: WO2005/109026

PCT Pub. Date: Nov. 17, 2005

(65) Prior Publication Data

US 2007/0244385 A1 Oct. 18, 2007

(30) Foreign Application Priority Data

May 7, 2004 (IT) .................... SV2004A0020

(51) Int. Cl.
*G01V 3/00* (2006.01)
(52) U.S. Cl. .................... 324/318; 324/319
(58) Field of Classification Search ......... 324/300–322; 600/407–445; 335/299, 302
See application file for complete search history.

(56) References Cited

U.S. PATENT DOCUMENTS

| | | | | |
|---|---|---|---|---|
| 5,315,276 A | * | 5/1994 | Huson et al. ............. | 335/216 |
| 5,744,960 A | * | 4/1998 | Pulyer ..................... | 324/320 |
| 6,198,286 B1 | * | 3/2001 | Trequattrini et al. ...... | 324/319 |
| 6,958,577 B2 | * | 10/2005 | Biglieri et al. ........... | 324/318 |
| 7,453,264 B2 | * | 11/2008 | Trequattrini et al. ...... | 324/318 |
| 7,538,553 B2 | * | 5/2009 | Trequattrini et al. ...... | 324/319 |
| 7,734,324 B2 | * | 6/2010 | Biglieri et al. ........... | 600/407 |

(Continued)

FOREIGN PATENT DOCUMENTS

EP 0 965 305 A1 12/1999

(Continued)

*Primary Examiner*—Brij B Shrivastav
(74) *Attorney, Agent, or Firm*—Buchanan Ingersoll & Rooney PC (57) ABSTRACT

A magnet structure for an MRI apparatus utilizing a permanent magnet, which apparatus has an inverted U shape with two essentially parallel opposed pole pieces, which are supported at a predetermined distance from each other by an inverted U-shaped magnetic yoke, which pole pieces and/or at least a portion of which yoke delimit a cavity for receiving at least a part of the patient's body, whereas a partial volume is generated in the volume of said cavity, which has such magnetic field values as to provide MRI images of a sufficient quality to enable the use thereof as diagnostic images, i.e. a so-called imaging volume. According to the invention, the distance (D1) between the pole pieces (1, 2) of the magnet structure is of 36 to 42 cm, and the pole pieces (1, 2) have a surface area of 4500 to 5500 cm². The invention also relates to an MRI imaging apparatus, particularly designed for the spine region, or a part thereof, and which has a magnet structure as described above.

29 Claims, 7 Drawing Sheets

U.S. PATENT DOCUMENTS

2002/0056185 A1   5/2002   Benz et al.
2002/0190827 A1   12/2002  Aoki et al.

FOREIGN PATENT DOCUMENTS

| | | | |
|---|---|---|---|
| GB | 2 282 451 A | 4/1995 |
| JP | 8-45729 A | 2/1996 |
| WO | WO 94/07250 A1 | 3/1994 |

* cited by examiner

MAGNET STRUCTURE FOR MRI APPARATUS AND MRI APPARATUS

The invention relates to a magnet structure for an MRI apparatus utilizing a permanent magnet, which apparatus has an inverted U shape with two essentially parallel opposed pole pieces, which are supported at a predetermined distance from each other by an inverted U-shaped magnetic yoke, which pole pieces and/or at least a portion of which yoke delimit a cavity for receiving at least a part of the patient's body, whereas a partial volume is generated in the volume of said cavity, which has such magnetic field values as to provide MRI images of a sufficient quality to enable the use thereof as diagnostic images, i.e. a so-called imaging volume.

A number of criteria have to be accounted for in the construction of magnet structures for MRI apparatuses, depending on operating requirements.

First, the size of the magnet structure depends on the size of the cavity that is designed to receive the patient or a part of the patient's body. The size of such cavity essentially depends on the type of anatomic regions for whose MRI imaging the apparatus is designed. In an apparatus designed for MRI imaging of the spine or at least a portion thereof, the cavity shall have such a size as to allow the introduction of at least a portion of the trunk or the whole trunk of the human body. Therefore, the distance between the pole pieces, known as gap, shall be based on the anterior-posterior dimension of the human trunk, including the range of variation of said dimension. Moreover, the patient receiving cavity shall have such a depth, i.e. a dimension transverse to the longitudinal direction of the spine, as to allow the spine to be positioned within the above mentioned imaging volume, which typically only occupies a partial area of the overall volume of the patient receiving cavity and is typically essentially centered with respect to the patient receiving cavity.

The shape and size of the imaging volume are in turn defined by the morphology and size of the anatomic region to be examined. Also, the size of the imaging volume with respect to the cavity volume is limited. In fact, the homogeneity of the static magnetic field required to obtain images with a sufficient diagnostic quality can only be obtained by using a limited three-dimensional area of the overall patient receiving cavity volume.

On the other hand, the sizes of the patient receiving cavity and the imaging volume, which are defined according to the requirements associated to the morphology and size of the patient body and of the anatomic region under examination have in turn an influence on the characteristics of the magnetic field, particularly the static magnetic field to be generated between the two opposed pole pieces.

Furthermore, the strength of the static magnetic field affects both the resolution of acquired images and the signal-to-noise ratio.

The strength of the static magnetic field is in turn determined by the construction of the magnet structure and particularly by the structure of the pole pieces, which include magnetized elements and ferromagnetic or high permeability elements, hence by the magnetic characteristics of these elements. The structure of the magnetic yoke and the magnetic characteristics thereof also influence the characteristics of the static magnetic field.

Considering the limits defined above for the construction of a magnet structure for an MRI apparatus, all these limits apparently have a direct influence on the size of the magnet structure.

To obtain a magnet structure with the smallest possible size, while providing large patient receiving cavity volumes, and the largest possible imaging volumes, and to generate a static magnetic field having such characteristics as to ensure the highest possible resolution and the best possible signal-to-noise ratio, prior art size and construction rules cannot be used, because they would lead to huge magnet structures.

In addition to obvious advantages in terms of costs, magnet structure size reduction provides the advantage of affording less heavy and bulky apparatuses, therefore an easier installation thereof. A smaller and lighter MRI apparatus affords the considerable advantage of requiring no or little provision of specially designed facilities for the MRI apparatus, in terms of both installation volume and static strength of floors. Also, a comparatively small apparatus allows the installation of several MRI apparatuses in premises in which a single apparatus was generally provided.

The object of the invention is to provide a magnet structure for an MRI apparatus, which allows MRI imaging of the spine region, while maintaining a minimized size of the structure, and with no image quality degradation which might make images unusable or diagnostically unreliable.

The invention fulfils the above object by providing a magnet structure for an MRI apparatus, particularly for an MRI apparatus for diagnostic imaging of the spine region or parts thereof, as described hereinbefore, wherein the distance between the pole pieces of the magnet structure is of 36 to 42 cm, and the pole pieces have a surface area of 4500 to 5500 $cm^2$.

Particularly, the invention provides a magnet structure in which the distance between the pole pieces is of 39 cm and the surface area of the pole pieces is of 5000 $cm^2$.

The static magnetic field has a strength of 0.2 to 0.3 Tesla, particularly of 0.24 to 0.26 and especially of 0.24 Tesla.

The homogeneity of this field has a peak-to-peak variation of about 50 ppm (parts per million) in a 25 cm diameter sphere.

The magnetic field is obtained by using a magnet structure with a magnetized layer, particularly-made of neodymium, in which the remanence of the neodymium is of 1.24 to 1.30 T, the neodymium layer having a thickness of 12.3 cm and a surface extension of the same order as the surface of the pole pieces.

The high permeability layer of the pole pieces has a maximum permeability of the order of 6000.

According to an improvement, each pole piece is composed of two layers, a solid layer, having a thickness of 4.5 cm and the same surface as the pole piece and a laminated layer having a thickness of 1 cm and a surface of the same order as the surface of the pole piece. The maximum permeability of the laminated layer is of 5000 to 7000, preferably of 6000.

In order to maximize the imaging volume size with respect to the patient receiving cavity volume, the magnetic pole piece and particularly the solid surface layer has two peripheral steps which respectively have an overhang of 3 to 4 cm and of 2 to 2.5 cm from the free surface of the pole piece, preferably of 3.5 and 2.2 cm respectively and a thickness, parallel to the free surface of the pole piece of 2 to 6 cm for the first step and of 2 cm to 4 cm for the second, preferably of 5 cm and 3 cm respectively.

Thanks to this arrangement, outward bowing of magnetic field lines along the peripheral areas of the pole pieces is reduced, and the imaging volume is extended parallel to the surface of the pole pieces.

The magnetic yoke has a C or inverted U shape and is made of a ferromagnetic material, with a carbon content of 0.22% or less.

The yoke is composed of three plates having a width of the same order of magnitude as the corresponding dimension of the pole piece, i.e. of 70 to 90 cm, preferably of 80 cm.

The yoke has an average thickness of 20 to 30 cm, particularly 25 cm, and an overall volume of material of 500 to 600 cm$^3$, particularly of about 550 cm$^3$.

The imaging volume is delimited by a sphere having a diameter of 20 to 30 cm, preferably about 25 cm.

Advantageously, the imaging volume is an ellipsoid having a longest diameter of 35 to 25 cm and a shortest diameter of 30 to 20 cm.

The imaging volume has a sufficient size as to allow imaging of parts of the spine, in which the most frequent diseases occur. Particularly, panoramic imaging of the cervical or lumbar regions of the spine may be performed.

Thanks to the above combination of dimensional characteristics and construction parameters of the magnet structure, a magnet structure may be obtained which is as small as possible and has a smaller weight than MRI apparatuses designed for spine imaging. Such size and weight reduction also allows to mount the magnet structure in such a manner as to allow it to move, for instance translate in one or more directions and/or rotate, without requiring large and complex support and guide structures, and with no substantial influence of such structures on the final size of the MRI apparatus which incorporates the magnet structure.

The achievable resolution is sufficient to obtain optimal diagnostic images, and is of less than 1 mm, preferably of 0.5 mm.

The invention also relates to an MRI imaging apparatus, particularly designed for the spine region, or a part thereof, and which has a magnet structure having one or more of the above characteristics.

In this case, the apparatus also includes gradient coils, RF exciting pulse transmitter coils, an electromagnetic shield and at least one receiver coil, as well as possibly a patient bed or table.

According to this invention, the gradient coils and/or the transmitter coils are composed of laminated packs of conductive tracks which are separated by electrically insulating layers or sheets. Particularly, a layer of conductive tracks is provided for each gradient coil, which layer is separated by a plastic sheet from the layer of conductive tracks of a further gradient coil. Advantageously, the layers of conductive tracks which form the gradient coils are made of electrically conductive sheets, which are suitably cut out to form the conductive tracks for the corresponding gradient coil. The thicknesses of the conductive layers are of 0.1 cm to 0.4 cm, particularly of 0.3 cm, whereas the thicknesses of the insulating layers are of 0.01 cm to 0.05 cm, particularly of the order of 0.03 cm. The overall thickness of the gradient coils integrated in a single laminated element is of 0.3 cm and 2.5 cm, particularly of the order of magnitude of 1.5 cm.

The exciting pulse transmitter coil also has a flat structure and a thickness of 0.01 cm to 0.15 cm, particularly of the order of 0.08 cm.

The electromagnetic shield is composed of an electrically conductive plate, lying over the pole pieces and having a conductivity of 1.7 μΩcm to 2.8 μΩcm, particularly of the order of 1.7 μΩcm, and a thickness of 10 to 70 μm and particularly of the order of 35 μm.

The gap between the pole pieces which have been fitted with the gradient coils and the corresponding portion of the transmitter coil as well as the electromagnetic shield and possibly a finishing and covering case is of 36 cm to 40 cm, and particularly of 37.5 cm to 38.5 cm, especially said gap is of the order of about 38 cm.

A patient bed or table is also slideably mounted immediately above one of the two pole pieces on the inner side of the patient receiving volume, said table or bed being capable of sliding on guides outside the patient receiving cavity and the pole piece surface whereto the bed or table is associated, and the thickness of the table being of 3 cm to 6 cm, preferably of 4 cm to 5 cm, particularly of the order of 4.5 cm.

The receiver coil is a surface coil and is accommodated within the thickness of the patient bed or table in such a manner as to have an overall thickness of 2 cm and 7 cm, preferably of 3.5 to 6 cm, particularly of the order of 4 cm.

Therefore, when the MRI apparatus is in the finished condition, the distance between the support side of the bed or table and the facing surface of the pole piece opposite the table is of 29 cm to 35 cm, preferably of 30 cm to 34 cm, particularly of the order of 32.7 cm.

Thanks to the above characteristics, the magnet structure of the invention has a maximum volume of about 1 m$^3$ to about 2 m$^3$, with dimensions of 120 cm×120 cm×70 cm to 150 cm×150 cm×90 cm, preferably of the order of 136 cm×133 cm×82 cm.

The apparatus may be inscribed in a parallelepiped having a maximum volume of about 1 m$^3$ to about 2 m$^3$, with dimensions of 120 cm×120 cm×70 cm to 150 cm×150 cm×90 cm, preferably of the order of 136 cm×133 cm×82 cm.

The weight of the magnet structure is of 5000 kg to 6500 kg, whereas the weight of the apparatus is of 7000 kg to 9000 kg.

Further improvements will form the subject of the dependent claims.

The characteristics of the invention and the advantages derived therefrom will appear more clearly from the following description of a non limiting embodiment, illustrated in the annexed drawings, in which.

Figure 1:
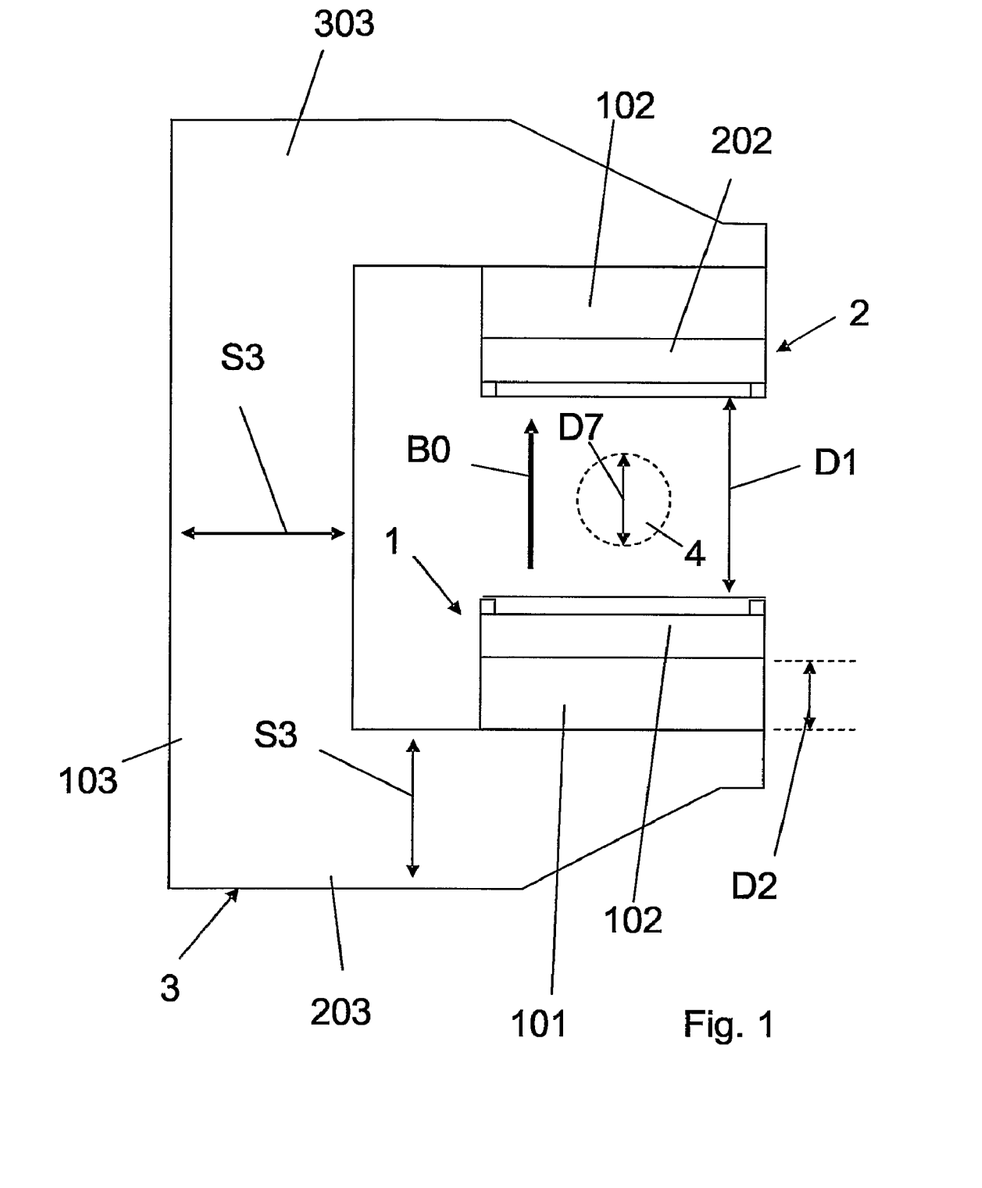
FIG. 1 is a diagrammatic side view of a magnet structure according to the invention.

Referring to the figures, a magnet structure, particularly for Nuclear Magnetic Resonance imaging apparatuses, comprises an inverted U-shaped magnetic yoke 3, which has three arms 103, 203, 303, two parallel arms, overhangingly projecting from a connection arm 103 which is oriented parallel to the static magnetic field lines B0, that the magnet structure is designed to generate between the pole pieces 1 and 2.

The yoke is composed of three plates, removably connected together by screw fastener means, such as bolts or the like, which are made of a ferromagnetic material having a carbon content of 0.22% or less. The two arms 203 and 303 are essentially parallel and carry two magnetic pole pieces at their ends, which are generally designated by numerals 1 and 2. The facing surfaces of the magnetic pole pieces are at a distance from each other, designated as D1, of 36 to 42 cm. The pole pieces 1, 2 preferably have a circular shape and each have a surface area of 4500 to 5500 cm$^2$.

Figure 3:
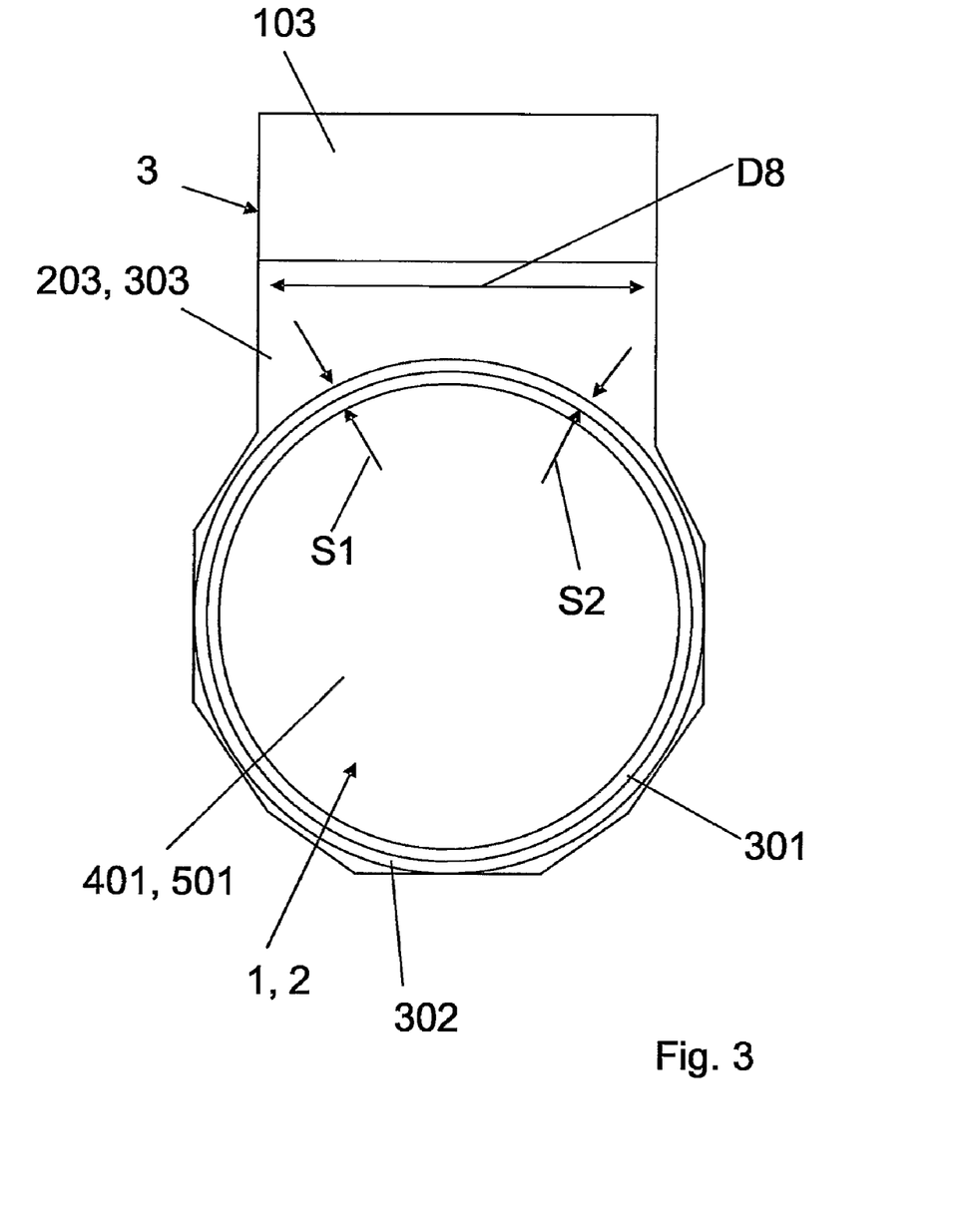
FIG. 3 is a top plan view of a pole piece, with the portion of the yoke for connecting the two pole piece supporting portions of the yoke, being shown in a section taken along a median transverse plane.

The plates 203 and 303 which support the pole pieces 1, 2 have a width that is shorter than the diameter of the pole pieces and become wider at their overhanging free ends whereto the two pole pieces 1 and 2 are attached, with a widening portion having essentially the same surface and shape as those of the pole pieces 1, 2. For an easier fabrication of the plates 203, 303, such widening portion is not rounded at its periphery, and has a polygonal shape approximating the circular shape of the pole pieces 1 and 2.

The three plates 103, 203, 303 of the yoke 3 may have a width D8 of the same order of magnitude as the corresponding dimension of the pole piece, i.e. of 70 to 90 cm, preferably of 80 cm.

The yoke 3 has an average thickness S3 of 20 to 30 cm, particularly 25 cm, and an overall volume of material of 500 to 600 cm$^3$, particularly of about 550 cm$^3$.

As shown in the figures, the yoke, and particularly the plates 203, 303 may decrease in thickness toward their free ends whereto the pole pieces 1, 2 are attached. Such thinning portion essentially starts at the tangent of the pole piece 1, 2 on the side thereof turned toward the plate 103 perpendicular to the pole pieces 1, 2, whereas thickness decreases in a substantially continuous fashion toward the ends of the pole piece 1, 2 supporting plates 203, 303 to a thickness of the order of half the greatest thickness of the plates or even less.

A magnetized layer 101, 102 is provided between the pole pieces 1 and 2 and the facing support sides of the plates 203, 303. Preferably, this layer is made of neodymium having a remanence of 1.24 to 1.30 Tesla. This is obtained by using neodymium layers 101, 201 having a thickness D2 of 12.3 cm and a surface extension of the same order of magnitude as the pole pieces 1 and 2. Like the plates 203, 303 of the yoke 3, the neodymium layers 101, 201 do not exactly follow the circular shape of the pole pieces 1, 2 but approximate it with a stepped profile. This construction allows to form the neodymium layers 101, 201 by using neodymium blocks which are fixed together and all have the same rectangular or square parallelepiped shape.

The pole pieces 1, 2 are made of a first high permeability layer 102, 202. The selected maximum permeability is of the order of about 6000. The high permeability layers 102, 202 are directly attached to the neodymium layers 202, 302.

Figure 2:
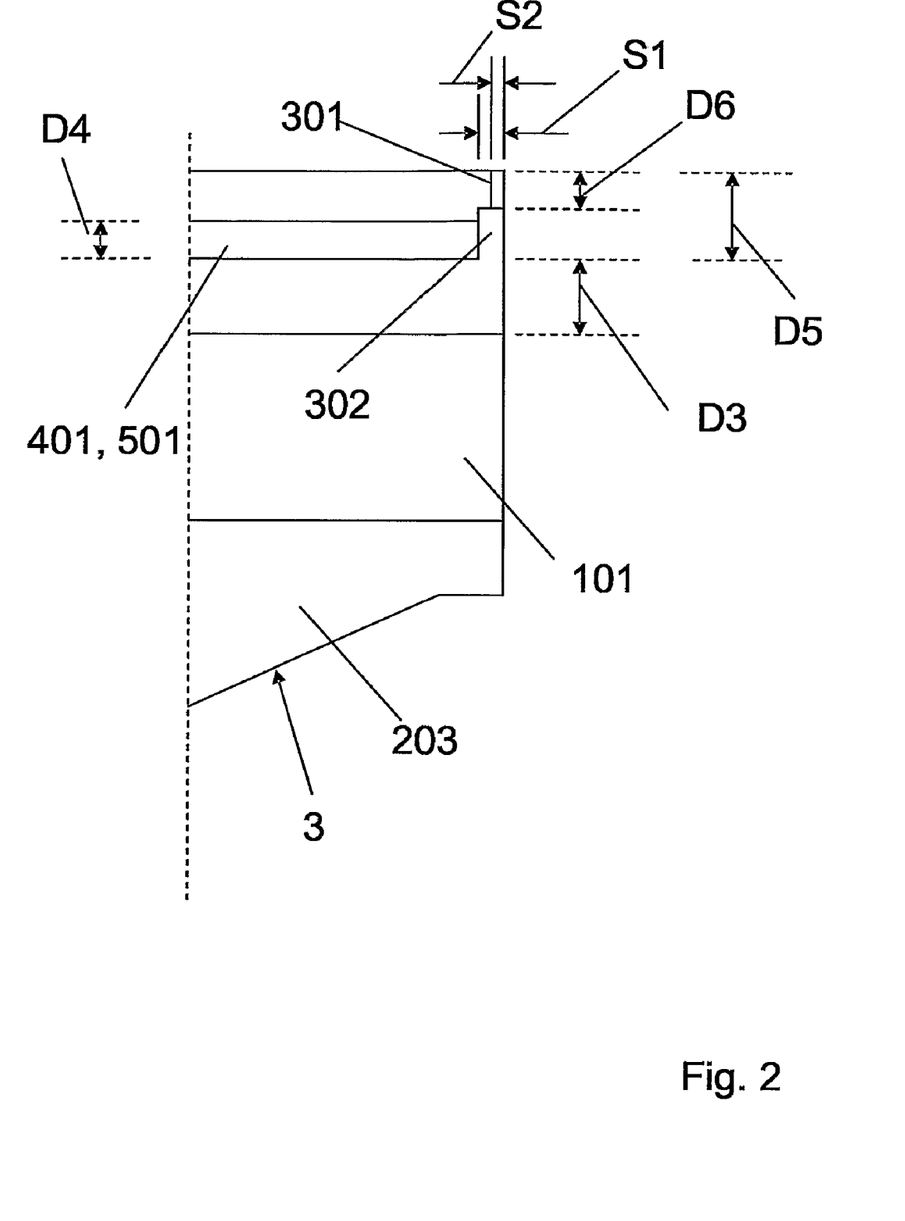
FIG. 2 is a view of an enlarged portion of the two peripheral steps of one of the pole pieces of the magnet structure as claimed in claim 1.

According to an additional characteristic, each pole piece is composed of two layers, a solid layer, having a thickness D3 of 4.5 cm and the same surface as the pole pieces and a laminated layer 401, 501 having a thickness D4 of 1 cm and a surface of the same order as the surface of the pole pieces 1, 2, the maximum permeability of the laminated layer being of 5000 to 7000, preferably of 6000.

The solid layer that forms the pole pieces 1 and 2 has two steps formed at its periphery, which form a frame wherein the laminated layer 401, 501 is enclosed. These two peripheral steps 301, 302 have an overhang D5 from the free surface of the pole piece of 3 to 4 cm, whereas the first step has an overhang D6 of 2 to 2.5 cm, preferably 3.5 cm and 2.2 cm respectively, and the thicknesses S1 and S2 of the two steps parallel to the free surface of the pole piece are of 2 to 6 cm and of 2 cm to 4 cm respectively, preferably of 5 cm and 3 cm respectively.

The above magnet structure generates a static magnetic field, designated as B0, between the pole pieces 1 and 2, which has a strength of 0.2 to 0.3 Tesla, particularly of 0.24 to 0.26 and especially of 0.24 Tesla. The homogeneity of the static magnetic field B0 has a peak-to-peak variation of about 50 ppm (parts per million) within a 25 cm diameter sphere. This sphere, designated by numeral 4, is the so-called imaging volume, i.e. the portion of space within the patient receiving cavity formed between the pole pieces of the magnet structure in which the magnetic field characteristics are sufficient to ensure a good quality MRI imaging, particularly for diagnostic purposes. The imaging volume 4 is delimited by a sphere which may have a diameter D7 of 20 to 30 cm, preferably of about 25 cm.

The above magnetic characteristics allow to achieve a sufficient imaging resolution to obtain optimal diagnostic images, i.e. of less than 1 mm, preferably of 0.5 mm.

Advantageously, when the anatomic region to be examined has an elongated shape, the imaging volume may be shaped or stretched in one direction, thereby taking the shape of an ellipsoid. In this case, the ellipsoid may have a longest diameter of 35 to 25 cm and a shortest diameter of 30 to 20 cm.

The above magnet structure has a maximum volume of about 1 m$^3$ to about 2 m$^3$, with dimensions of 120 cm×120 cm×70 cm (height×depth×width) to 150 cm×150 cm×90 cm (height×depth×width), preferably of the order of 136 cm×133 cm×82 cm (height×depth×width).

The overall weight is of the order of 5000 kg to 6500 kg.

The above clearly shows that the magnet structure of the invention provides the highest performance in terms of characteristics of the static field B0, as well as the greatest gap, i.e. the greatest possible distance between the pole pieces 1, 2 and the largest possible imaging volume, relative to said gap and to the surface of the pole pieces, the whole in combination with comparatively smaller weight and volume for the type of apparatus for which the above magnet structure is preferably designed.

This provides considerable advantages, as the reduced weight and volume allow to considerably facilitate installation and/or positioning of an MRI apparatus having identical functionalities, and particularly also dedicated to imaging of the spine region. Moreover, the comparatively smaller weight and volume of the magnet structure allow translatable and rotatable mounting thereof, while allowing the use of comparatively small support structures and translating and/or rotary means both as regards the force to be exerted or supported by said support means and structures, and as regards space requirements and weight of said support means and structure. Therefore, the magnet structure may be displaced by a simple translation and/or a simple rotation, with the support structure and the displacement means adding no significant volume and weight to a MRI apparatus based on said magnet structure. Volume and weight dimensioning strongly affects fabrication costs, both as regards handling, installation and assembly of the parts of the magnet structure and ad regards transportation thereof to the installation site.

From the functional point of view, the magnet structure of this invention allows to make Nuclear Magnetic Resonance Imaging apparatuses with considerable features, particularly allowing to perform imaging in several different conditions and/or postures of patients.

A Nuclear Magnetic Resonance Imaging apparatus incorporating a magnet structure according to this invention is shown in FIGS. 4 to 7.

Figure 4:
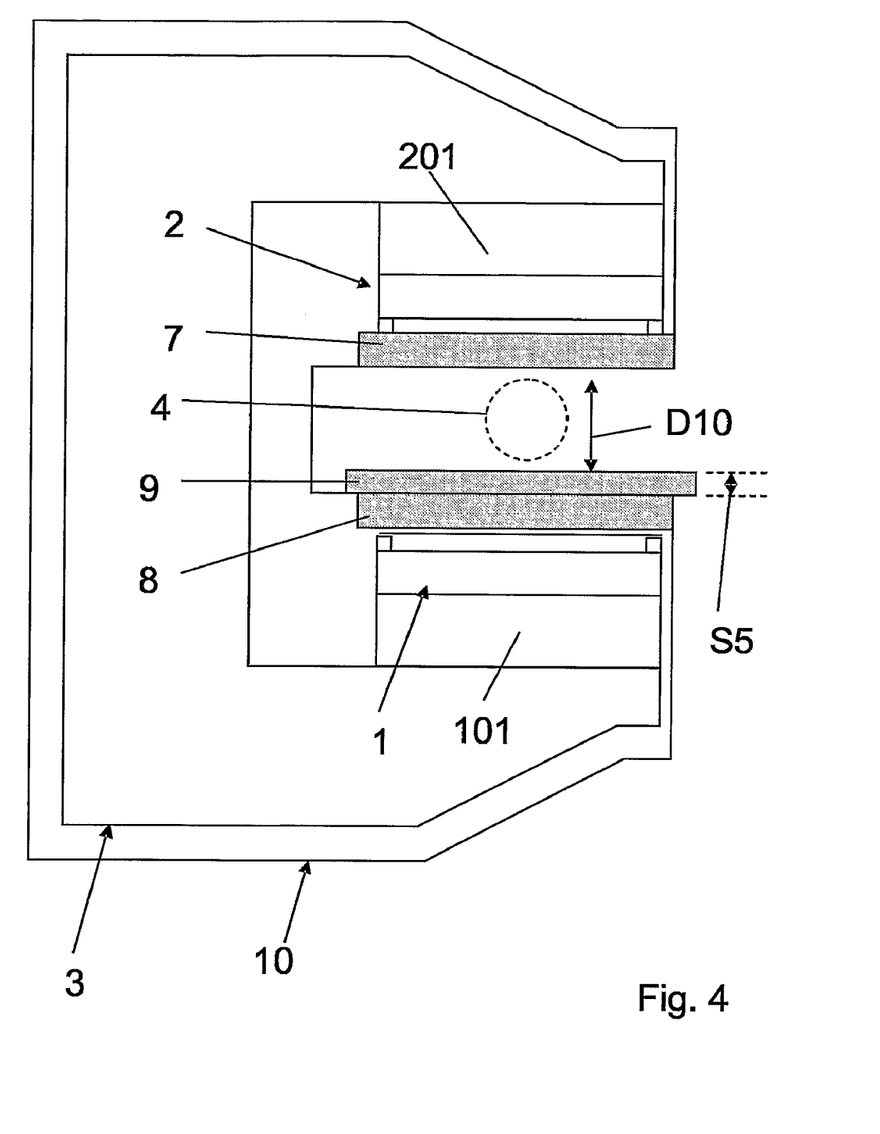
FIG. 4 is a view of the magnet structure of the previous figures, integrated in a finished apparatus.

FIG. 4 schematically shows an MRI imaging apparatus, particularly for the spine region, or a portion thereof, and which has a magnet structure as described above. The apparatus also includes gradient coils, RF exciting pulse transmitter coils, an electromagnetic shield and at least one receiver coil, as well as possibly a patient bed or table. Such gradient coils, RF exciting pulse transmitter coils and the electromagnetic shield are schematically generally designated by rectangles 7 and 8. The patient table is shown in a separate position and designated by numeral 9. The magnet structure and the gradient coils, the RF exciting pulse transmitter coils and the electromagnetic shield are enclosed in an exterior shell, which is designated by numeral 10.

To afford a dimensionally flat construction, with the least reduction of the gap, i.e. the distance between the pole pieces which support the gradient coils, the transmitter coil and the electromagnetic shield, as well as the covering shell, the gradient coils and/or the transmitter coils are formed by laminated packs of conductive tracks, separated from each other by electrically insulating layers or sheets. Particularly, a layer of conductive tracks is provided for each gradient coil, which layer is separated by a plastic sheet from the layer of conductive tracks of a further gradient coil. The layers of conductive tracks which form the gradient coils are made of electrically conductive sheets, which are suitably cut out to form the conductive tracks for the corresponding gradient coil.

The thicknesses of the conductive layers are of 0.1 cm to 0.4 cm, particularly of 0.3 cm, whereas the thicknesses of the insulating layers are of 0.01 cm to 0.05 cm, particularly of the order of 0.03 cm. By this arrangement, the overall thickness of the gradient coils integrated in a single laminated element is of 0.3 cm and 2.5 cm, particularly of the order of 1.5 cm.

The exciting pulse transmitter coil also has a flat structure and a thickness of 0.01 cm to 0.15 cm, particularly of the order of 0.08 cm.

Therefore, the gap $D_{10}$ between the pole pieces whereto the gradient coils and the corresponding portion of the transmitter coil, as well as the electromagnetic shield and possibly a finishing and covering case, are mounted, is of 36 cm to 40 cm, and particularly of 37.5 cm and 38.5 cm, especially said gap $D_{10}$ is of the order of about 38 cm. This dimension allows to conveniently receive any patient within the imaging cavity of the apparatus.

The patient bed or table 9 is slideably mounted immediately above one of the two pole pieces 1 on the inner side of the patient receiving volume, said table or bed 9 being capable of sliding on guides (not shown) outside the patient receiving cavity and the pole piece surface whereto the bed or table is associated, and the thickness $S_5$ of the table being of 3 cm to 6 cm, preferably of 4 cm to 5 cm, particularly of the order of 4.5 cm.

Figure 5:
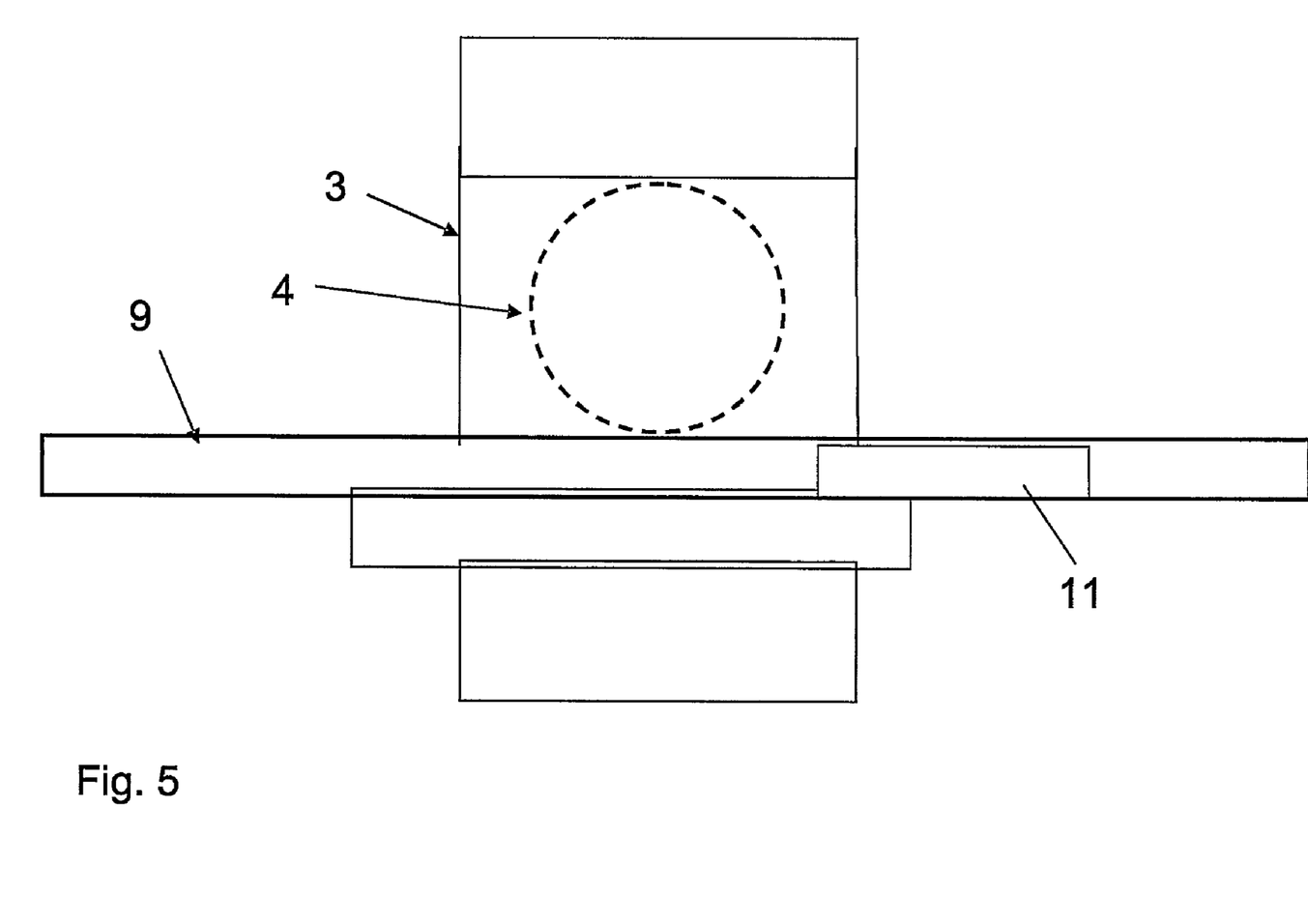
FIG. 5 is a longitudinal section of the table in which a surface receiver coil for spine imaging is integrated, in a housing which extends in the thickness of the table.

As schematically shown in FIG. 5, particularly for Magnetic Resonance imaging of the spine, a receiver coil 11 is provided, which is a surface coil and is accommodated within the thickness of the patient bed or table 9 in such a manner as to have an overall thickness of 2 cm and 7 cm, preferably of 3.5 to 6 cm, particularly of the order of 4 cm, anyway of such a value as to remain within the thickness of the table and project therefrom to a limited extent.

Further types of annular or closed receiver coils may be attached to the table in appropriate seats, not shown.

When the MRI apparatus is in the finished condition, the distance between the support side of the bed or table and the facing surface of the pole piece opposite the table is of 29 cm to 35 cm, preferably of 30 cm to 34 cm, particularly of the order of 32.7 cm.

By using the inventive magnet structure and thanks to the construction peculiarities of the gradient coils, the transmitter coils, the electromagnetic shield, as well as the table and the receiver coil designed for the spine, the apparatus may be inscribed in a parallelepiped having a maximum volume of about 1 m$^3$ to about 2 m$^3$, with dimensions of 120 cm×120 cm×70 cm to 150 cm×150 cm×90 cm, preferably of the order of 136 cm×133 cm×82 cm, obviously excluding the support structure or base.

Anyway, the apparatus has a weight of 7000 kg to 9000 kg, and is lighter than prior art apparatuses having similar imaging features, especially intended for spine imaging, and considering that this apparatus is based on a magnet structure in which the magnetic field is generated by permanent magnets.

Figure 6:
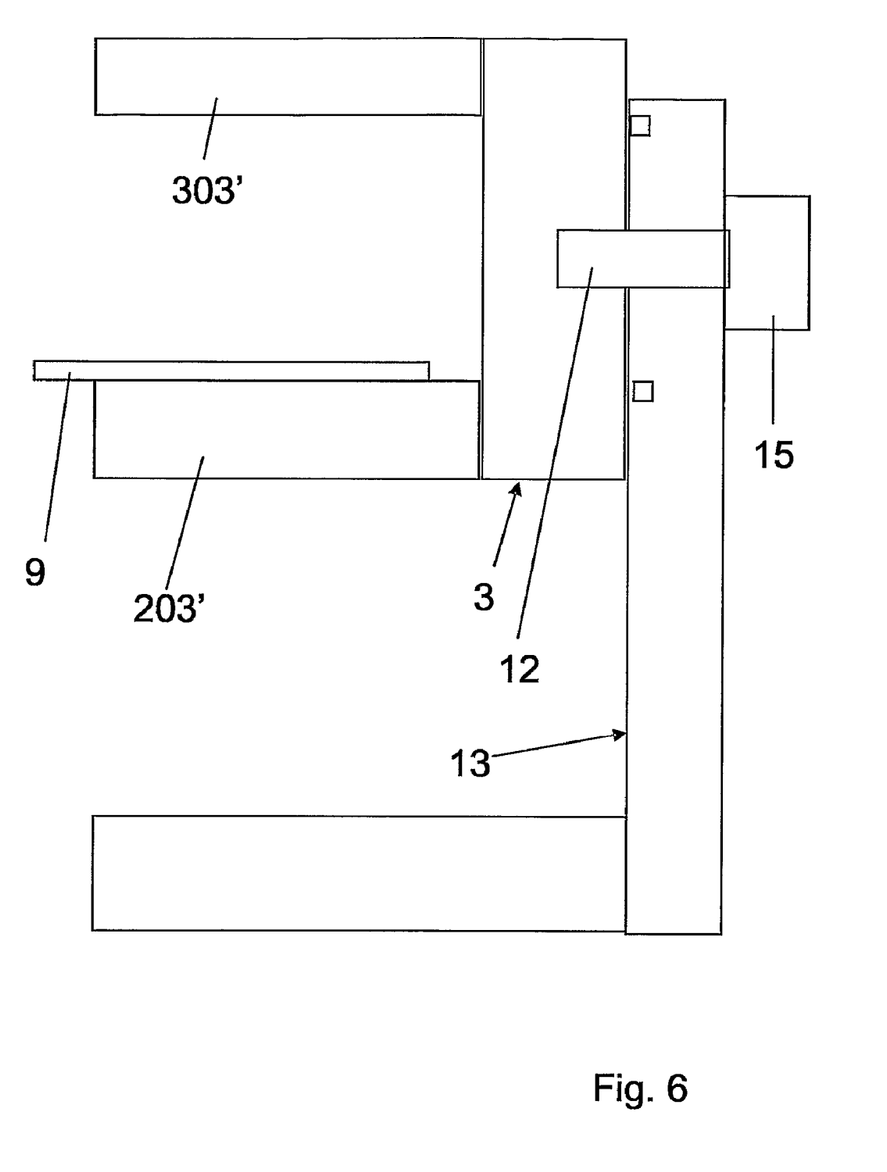
FIG. 6 is a schematic sectional view as taken along a vertical plane, of an MRI apparatus, in which the magnet structure is supported in such a manner as to rotate with the table.
Figure 7:
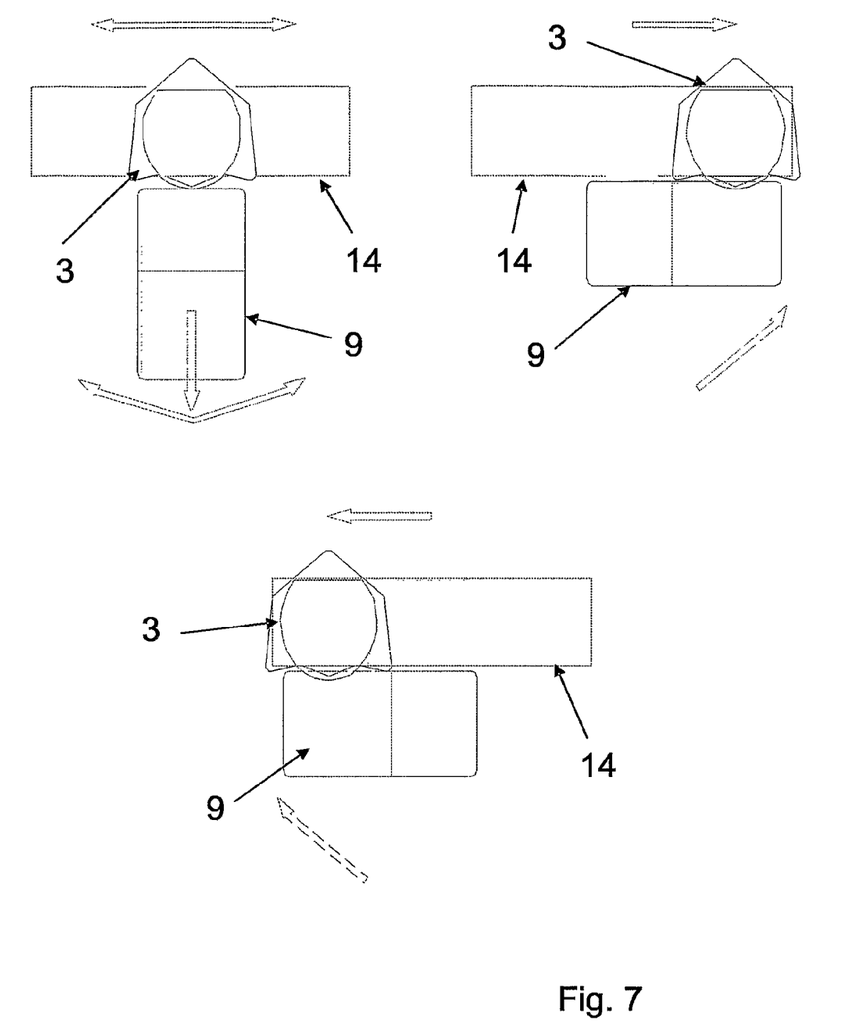
FIG. 7 is a schematic view of an MRI imaging apparatus in various positions, in which the magnet structure may be translated along a base thanks to guide means.

The size and weight characteristics of the magnet structure alone or the magnet structure with the transmitter coils, the gradient coils, the electromagnetic shield, the patient table associated thereto are such that the magnet structure may be mounted on a support structure or base in such a manner as to be able to rotate about an axis perpendicular to and centered with respect to the wall 103 of the yoke 3 or to slide along displacement guides.

This allows to perform MRI imaging of the patient in several different postures and orientations, with respect to the action of the gravitational force, which is advantageous when imaging the behavior of anatomic regions under load conditions.

Schematic embodiments of an apparatus in which the magnet structure rotates and of an apparatus in which it translates are schematically shown in FIGS. 6 and 7.

In FIG. 6, the magnet structure, as well as the transmitter coils and the gradient coils and the electromagnetic shield and the patient table are supported by a shaft 12 that is perpendicular to the plate 103 of the yoke which connects the two plates 203, 303 of the yoke, whereto the pole pieces are attached. For the sake of simplicity, the assembly of the pole pieces and the plates of the yoke, as well as transmitter coils, gradient coils, the shield and possibly the covering shell are incorporated in a rectangular element designated by numerals 203' and 303'. The table 9 is shown separately.

The shaft 12 is rotatably mounted in a vertical base structure element 13 and is rotatably driven by an actuator, e.g. a hydraulic or oil-hydraulic actuator 15.

Thus, the magnet structure may rotate with the table about a horizontal or essentially horizontal axis.

FIG. 7 shows a magnet structure which slides, together with the transmitter and gradient coils and the electromagnetic shield and the covering shell, on an upper straight guide of a base 14. The guide may also not be straight, and have a curved profile.

While the embodiments of FIGS. 6 and 7 separately show the rotation and translation of the finished magnet structure, the small size of the magnet structure, including the transmitter and gradient coils, the electromagnetic shield and the covering shell, allow the provision of a base in which said magnet structure may be both rotated and translated.

The above is provided in combination with the advantage that the base structure and the magnet structure displacing means have reduced powers and sizes, whereas the imaging volume is comparatively large and the magnetic field has such a quality as to provide useful images for diagnostic purposes.

The invention claimed is:

1. A magnet structure for an MRI apparatus utilizing a permanent magnet, wherein the magnet structure has an inverted U shape and comprises two essentially parallel opposed pole pieces, which are supported at a predetermined distance from each other by an inverted U-shaped magnetic yoke,
   wherein the pole pieces and/or at least a portion of the yoke delimit a cavity for receiving at least a part of a patient's body,
   wherein an imaging volume is defined in the volume of said cavity having magnetic field values so as to provide MRI images of a sufficient quality to enable the use of the images as diagnostic images, and wherein a distance between the pole pieces of the magnet structure is 36 to 42 cm, and the pole pieces have a surface area of 4500 to 5500 cm$^2$.

2. A magnet structure as claimed in claim 1, wherein a static magnetic field is generated between the pole pieces, which has a strength of 0.2 to 0.3 Tesla.

3. A magnet structure as claimed in claim 2, wherein homogeneity of said static magnetic field has a peak-to-peak variation of about 50 ppm (parts per million) within a 25 cm diameter sphere.

4. A magnet structure as claimed in claim 2, wherein the static magnetic field is obtained when the magnet structure has a magnetized layer made of neodymium, in which the remanence of the neodymium is 1.24 to 1.30 T, the neodymium layer having a thickness of 12.3 cm and a surface area of the same order as a surface area of the pole pieces.

5. A magnet structure as claimed in claim 4, wherein the pole pieces have a high permeability layer, which has a maximum permeability of the order of about 6000.

6. A magnet structure as claimed in claim 5, wherein said high permeability layer lies over the magnetized layer made of neodymium.

7. A magnet structure as claimed in claim 5, wherein each high permeability layer of each pole piece comprises two layers, a solid layer having a thickness of 4.5 cm and the same surface area as the pole pieces and a laminated layer having a thickness of 1 cm and a surface area of the same order as the surface area of the pole pieces, the maximum permeability of the laminated layer being 5000 to 7000.

8. A magnet structure as claimed in claim 1, wherein a solid surface layer of each pole piece has two peripheral steps which respectively have an overhang of 3 to 4 cm and of 2 to 2.5 cm from a free surface of the pole piece, and a thickness, parallel to the free surface of the pole piece of 2 to 6 cm for the first step and of 2 cm to 4 cm for the second step.

9. A magnet structure as claimed in claim 1, wherein the magnetic yoke has a C or inverted U shape and is made of a ferromagnetic material, with a carbon content of 0.22% or less.

10. A magnet structure as claimed in claim 1, wherein the yoke comprises three plates having a width of the same order of magnitude as the corresponding dimension of the pole piece, in the range of 70 to 90 cm.

11. A magnet structure as claimed in claim 1, wherein the yoke has an average thickness of 20 to 30 cm and an overall volume of material of 500 to 600 cm$^3$.

12. A magnet structure as claimed in claim 1, wherein the imaging volume is delimited by a sphere having a diameter of 20 to 30 cm.

13. A magnet structure as claimed in claim 1, wherein the imaging volume is an ellipsoid having a longest diameter of 35 to 25 cm and a shortest diameter of 30 to 20 cm.

14. A magnet structure as claimed in claim 1, wherein the yoke has a width that is shorter than a diameter of the pole pieces, in a portion that does not coincide with the pole pieces, and wherein in a portion coinciding with the pole pieces, the yoke becomes wider to take a shape and an extension that are approximately a shape and an extension of the corresponding pole piece.

15. A magnet structure as claimed in claim 1, wherein the magnet structure is configured to achieve an imaging resolution of less than 1 mm to obtain optimal diagnostic images.

16. A magnet structure as claimed in claim 1, wherein the magnet structure has a maximum volume of about 1 in$^3$ to about 2 in$^3$, with dimensions of 120 cm×120 cm×70 cm to 150 cm×150 cm×90 cm.

17. A magnet structure as claimed in claim 1, wherein a weight of the magnet structure is of 5000 kg to 6500 kg.

18. A MR imaging apparatus, for the spine region, or a part thereof, comprising a magnet structure as claimed in claim 1, wherein the apparatus further includes gradient coils, RF exciting pulse transmitter coils, an electromagnetic shield and at least one receiver coil, and a patient bed or table, wherein the gradient coils and/or also the transmitter coils are formed by laminated packs of conductive tracks, which are separated from each other by electrically insulating layers or sheets, wherein a layer of conductive tracks is provided for each gradient coil, each layer being separated by a plastic sheet from the layer of conductive tracks of a further gradient coil.

19. An apparatus as claimed in claim 18, wherein the layers of conductive tracks which form the gradient coils are made of electrically conductive sheets, which are suitably cut out to form the conductive tracks for the corresponding gradient coil.

20. An apparatus as claimed in claim 18, wherein the thicknesses of the conductive layers are 0.1 cm to 0.4 cm and the thicknesses of the insulating layers are 0.01 cm to 0.05 cm.

21. An apparatus as claimed in claim 18, wherein an overall thickness of the gradient coils integrated in a single laminated element is 0.3 cm and 2.5 cm.

22. An apparatus as claimed in claim 18, wherein the exciting pulse transmitter coil has a flat structure and a thickness of 0.01 cm to 0.15 cm.

23. An apparatus as claimed in claim 18, wherein the electromagnetic shield comprises an electrically conductive plate, lying over the pole pieces and having a conductivity of 1.7 μΩcm to 2.8 μΩcm, and a thickness of 10 to 70 μm.

24. An apparatus as claimed in claim 18, wherein a gap between the pole pieces, upon which the gradient coils, the corresponding portion of the transmitter coil, the electromagnetic shield and a finishing and covering case have been mounted, is 36 cm to 40 cm.

25. An apparatus as claimed in claim 18, wherein the patient bed or table is slideably mounted immediately above one of the two pole pieces on an inner side of the patient receiving cavity, said table or bed being capable of sliding on guides outside the patient receiving cavity and the pole piece surface to which the bed or table is associated, and wherein a thickness of the table is 3 cm to 6 cm.

26. An apparatus as claimed in claim 25, further comprising a receiver coil, which is a surface coil and is accommodated within the thickness of the patient bed or table in such a manner as to have an overall thickness of 2 cm to 7 cm.

27. An apparatus as claimed in claim 18, wherein when the MRI apparatus is in a finished condition, a distance between a support side of the bed or table and a facing surface of the pole piece opposite the table is 29 cm to 35 cm.

28. An apparatus as claimed in claim 18, wherein the apparatus is configured to be enclosed in a parallelepiped having a maximum volume of about 1 m to about 2 m, with dimensions of 120 cm×120 cm×70 cm to 150 cm×150 cm×90 cm.

29. An apparatus as claimed in one claim 18, wherein a weight of the apparatus is 7000 kg to 9000 kg.

* * * * *